United States Patent
O

(10) Patent No.: US 6,836,436 B2
(45) Date of Patent: Dec. 28, 2004

(54) VOLTAGE GENERATOR FOR FLASH MEMORY DEVICE

(75) Inventor: Se Eun O, Soowon-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 45 days.

(21) Appl. No.: 10/329,697

(22) Filed: Dec. 27, 2002

(65) Prior Publication Data

US 2004/0012990 A1 Jan. 22, 2004

(30) Foreign Application Priority Data

Jul. 18, 2002 (KR) .................................. 10-2002-0042174

(51) Int. Cl.[7] .............................................. G11C 16/04
(52) U.S. Cl. ................................... 365/185.3; 365/226
(58) Field of Search .................... 365/185.3, 185.33, 365/185.09, 226

(56) References Cited

U.S. PATENT DOCUMENTS 5,597,274 A * 1/1997 Behner ....................... 408/204
5,822,252 A * 10/1998 Lee et al. ................. 365/185.3

* cited by examiner

Primary Examiner—Thong Q. Le
(74) Attorney, Agent, or Firm—Piper Rudnick LLP

(57) ABSTRACT

The present invention relates to a flash memory device. Cell currents of an over-erased flash memory cell and cell currents of a plurality of weakly-programmed flash memory cells are compared by a plurality of comparators, and an low-voltage detector and a plurality of charge pump circuits are driven depending on the comparison result. Accordingly, a circuit that is not affected by variation in temperature, power supply voltage and process can be implemented. The threshold voltages of the flash memory cells are controlled to adjust a low-voltage detection point or a regulation point.

12 Claims, 5 Drawing Sheets

VOLTAGE GENERATOR FOR FLASH MEMORY DEVICE

BACKGROUND OF THE INVENTION

1. Field of the Invention

The invention relates generally to a voltage generator for a flash memory device. More particularly, the invention relates to a voltage generator for a flash memory device capable of implementing a circuit that is not affected by variation in the temperature, power supply voltage and process and freely controlling a low-voltage detection point or a regulation point by controlling the threshold voltages of flash memory cells, in a way that cell currents of over-erased flash memory cells and cell currents of a plurality of weakly-programmed flash memory cells are compared using a plurality of comparators, and a low-voltage detector and a plurality of charge pump circuits are driven depending on the comparison result.

2. Description of the Prior Art

In a flash memory device, in order to program or erase cells, it is required that a given high voltage be applied to each of the terminals of the cells. In order to generate the high voltage being applied to the terminals of the cells, a plurality of charge pump circuits having a pumping circuit and a regulation circuit are required. Also, as it is difficult to correctly perform the program and erase operations at a low voltage, a low-voltage detector for detecting the low voltage is required. Further, in order to operate the low-voltage detector and the plurality of the charge pump circuits, a plurality of comparators for comparing the reference voltage and a given voltage are necessary. A reference voltage generator for generating the reference voltage is also required.

A structure and operation of the conventional voltage generator for a flash memory device having the low-voltage detector, the plurality of the comparators and the plurality of the charge pump circuits will be now described by reference FIG. 1.

If the power supply voltage (Vcc) is divided by first and second resistors R11 and R12, a first comparator 105 compares the divided voltage and the reference voltage (Vref) supplied from the reference voltage generator 101 to produce a low voltage detection signal (LVCC). A first charge pump circuit 102 generates a positive high voltage (VPPD) that will be applied to a first terminal of the cell. A second charge pump circuit 103 generates a positive high voltage (VPPI) that will be applied to a second terminal of the cell. A third charge pump circuit 104 generates a negative high voltage (VEEI) that will be applied to a third terminal of the cell. Each of the first, second and third charge pump circuits 102, 103 and 104 includes a pumping circuit for pumping the high voltage and a regulation circuit for regulating the pumped voltage of the pumping circuit to a desired level. The output voltage (VPPD) of the first charge pump circuit 102 is divided by a first voltage divider 109 having a plurality of PMOS transistors. A second comparator 106 compares a divided voltage (V1) of the first voltage divider 109 and the reference voltage (Vref) and then controls the operation of the first charge pump circuit 102 depending on the comparison result. An output voltage (VPPI) of the second charge pump circuit 103 is divided by the second voltage divider 110 having a plurality of PMOS transistors. A third comparator 107 compares the divided voltage (V2) of the second voltage divider 110 and the reference voltage (Vref) and then controls the operation of the second charge pump circuit 103 depending on the comparison result. Further, the output voltage (VEEI) of the third charge pump circuit 104 is divided by a third voltage divider 111 having a plurality of NMOS transistors. A fourth comparator 108 compares the divided voltage (V3) of the third voltage divider 111 and the reference voltage (Vref) and then controls the operation of the third charge pump circuit 104 depending on the comparison result.

The voltage generator for a flash memory device constructed above is operated by comparing the reference voltage from the reference voltage generator and the respective compared voltage. However, the reference voltage generator is significantly affected by variation in the temperature or process and the power supply voltage. Thus, there is a need for the reference voltage generator that is not affected by those parameters in order to detect or regulate an exact low voltage for the flash memory device. However, there are problems that the reference voltage generator having these characteristics is difficult to implement and the circuit must be modified if there is the difference in the circuit and simulation result.

SUMMARY OF THE INVENTION

The present invention is contrived to solve the above problems and an object of the present invention is to provide a voltage generator for a flash memory device that is not affected by variation in temperature, process or the power supply voltage and can exactly detect and regulate a low voltage.

Another object of the present invention is to provide a voltage generator for a flash memory device that is not affected by variation in temperature, process or the power supply voltage and can exactly detect and regulate a low voltage, by controlling cell currents of over-erased flash memory cells and cell currents of weakly-programmed flash memory cells.

Still another object of the present invention is to provide a voltage generator for a flash memory device capable of freely controlling a low-voltage detection point or a regulation point, by adjusting the threshold voltages of the over-erased flash memory cells and the weakly-programmed flash memory cells to control the cell currents.

In order to accomplish the above object, the voltage generator for a flash memory device according to the present invention, is characterized in that it comprises over-erased flash memory cells, at least one or more programmed flash memory cells, and at least one or more comparators for comparing cell currents of the over-erased flash memory cells and cell currents of the programmed flash memory cells, wherein a low voltage is detected and the operations of at least one or more charge pump circuits are controlled, by outputs of the comparators.

In order to accomplish another object, the voltage generator for a flash memory device according to the present invention, is characterized in that it comprises a low-voltage detector for comparing cell currents of different states of two flash memory cells to detect variation in the power supply voltage, and a high voltage generating means for comparing cell the currents of different states of at least two or more flash memory cells to generate at least one or more given high voltages. The high voltage generating means comprises at least one or more charge pump circuits for pumping the power supply voltage to a given high voltage and regulating the pumped voltage to a given level, at least one or more voltage dividers for dividing outputs of the charge pump circuits, respectively; over-erased flash memory cells, at least one or more programmed flash memory cells, and at least one or more comparators for comparing cell currents of the programmed flash memory cells, respectively, based on cell currents of the over-erased flash memory cells and for controlling the charge pump circuits depending on the comparison result.

In order to accomplish still another object, a voltage generator for a flash memory device according to the present invention, is characterized in that it comprises at least one or more load means for supplying the power supply voltage, at least one or more charge pump circuits for pumping the power supply voltages to given high voltages and regulating the pumped voltages to given levels, at least one or more voltage dividers for dividing outputs of the charge pump circuits, over-erased flash memory cells, at least one or more programmed flash memory cells, at least two or more drain bias circuits for adjusting drain voltages of the over-erased flash memory cells and the at least two or more flash memory cells, at least two or more switching means driven by the drain bias circuits to establish current paths of the power supply terminals and the flash memory cells, and at least two or more comparators for comparing each of cell currents of the programmed flash memory cells based on the cell currents of the over-erased flash memory cells to detect decrease in the power supply voltage or to control the charge pump circuits.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
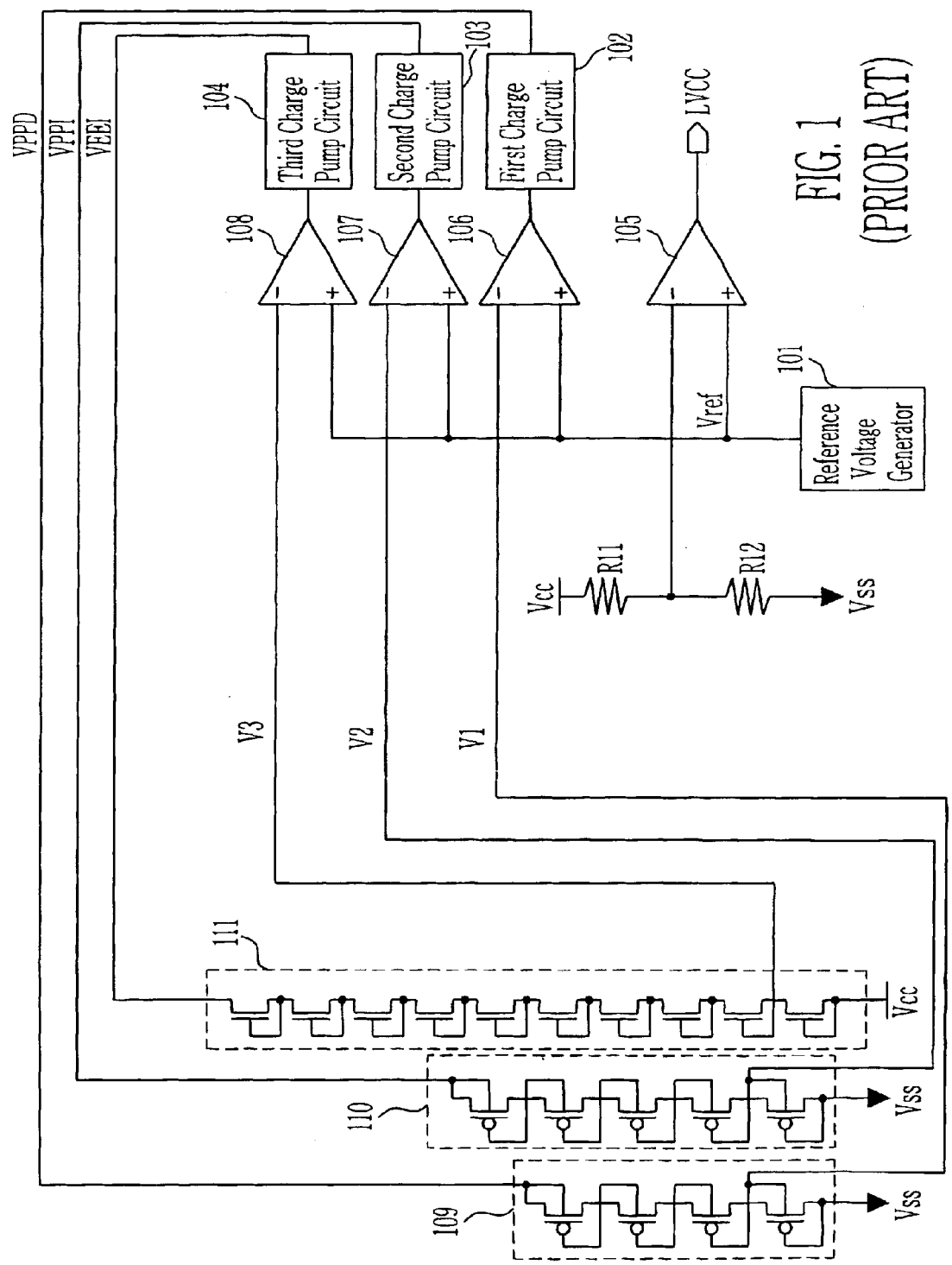
FIG. 1 shows a structure of a conventional voltage generator for a flash memory device having a low-voltage detector, a plurality of comparators and a plurality of charge pump circuits.

The present invention will be described in detail by way of a preferred embodiment with reference to accompanying drawings, in which like reference numerals are used to identify the same or similar parts.

A structure and operation of a voltage generator for a flash memory device having a low-voltage detector, a plurality of comparators and a plurality of charge pump circuits according to the present invention will be described by reference to FIG. 2.

First through fifth load means 201 through 205 are connected between the power supply terminal (Vcc) and first through fifth nodes Q21 through Q25, respectively. A first NMOS transistor N21 and a first flash memory cell M21 are serially connected between the first node Q21 and the ground terminal (Vss). A second NMOS transistor N22 and a second flash memory cell M22 are serially connected between the second node Q22 and the ground terminal (Vss). A third NMOS transistor N23 and a third flash memory cell M23 are serially connected between the third node Q23 and the ground terminal (Vss). A fourth NMOS transistor N24 and a fourth flash memory cell M24 are serially connected between the fourth node Q24 and the ground terminal (Vss). A fifth NMOS transistor N25 and a fifth flash memory cell M25 are serially connected between the fifth node Q25 and the ground terminal (Vss). The first through fifth NMOS transistors N21 through N25 are driven by first through fifth drain bias circuits 206 through 210. The first through fifth drain bias circuits 206 through 210 serve to control the drain voltages of the first through fifth flash memory cells M21 through M25. Meanwhile, the first flash memory cells M21 has a gate terminal connected to the ground terminal (Vss), and the second flash memory cells M22 has a gate terminal connected to the power supply terminal (Vcc). Also, the third through fifth flash memory cells M23 through M25 have gate terminals to which divided voltages of first through third voltage dividers 218 through 220 are applied.

The first comparator 214 compares the voltage level of the first node Q21 and the voltage level of the second node Q22 and then detects a low voltage depending on comparison result to output a low voltage detection signal (LVCC). Also, second through fourth comparators 215 through 217 compare the voltage of the first node Q21 and the voltage levels of the third through fifth nodes Q23 through Q25, respectively, to control the operations of the first through third charge pump circuits 211 through 213 depending on the respective comparison result.

The first charge pump circuit 211 generates a positive high voltage (VPPD) that will be applied to a source terminal of a main memory cell (not shown). The second charge pump circuit 212 generates a positive high voltage (VPPI) that will be applied to a gate terminal of the main memory cell. The third charge pump circuit 213 generates a negative high voltage (VEEI) that will be applied to a source terminal of the main memory cell. Each of the first, second and third charge pump circuits 211, 212 and 213 includes a pumping circuit for pumping the high voltage and a regulation circuit for regulating the pumping voltage of the pumping circuit to a desired level.

The first voltage divider 218 divides the output voltage (VPPD) of the first charge pump circuit 211. The divided voltage is then applied to the gate terminal of the third flash memory cell M23. The second voltage divider 219 divides the output voltage (VPPI) of the second charge pump circuit 212. The divided voltage is then applied to the gate terminal of the fourth flash memory cell M24. Further, the third voltage divider 220 divides the output voltage (VEEI) of the third charge pump circuit 21. The divided voltage is then applied to the gate terminal of the fifth flash memory cell M25.

At this time, the first flash memory cell M21 maintains an over-erased state. The second through fifth flash memory cells M22 through M25 maintain a weakly-programmed state. Therefore, a constant cell current is flowing into the first flash memory cell M21 without regard to variation in the power supply voltage (Vcc). The cell currents of the second through fifth flash memory cells M22 through M25 are varied if the power supply voltage (Vcc) is changed. Meanwhile, each of the cell currents of the first through fifth flash memory cells 21 through M25 can be controlled by adjusting the threshold voltages of them. Thereby, a desired low-voltage detection point or a regulation point can be controlled.

A method of driving the voltage generator for the flash memory device according to the present invention will be described roughly.

If the power supply voltage (Vcc) is applied to the first through fifth nodes Q21 through Q25 through the first through fifth load means 201 through 205, the first through fifth NMOS transistors N21 through N25 are controlled by the first through fifth drain bias circuits 206 through 210, so that a current path between the power supply terminal (Vcc) and the ground terminal (Vss) is formed. Thus, the voltage levels of the first through fifth nodes Q21 through Q25 are determined by the amount of current flowing into the ground terminal (Vss) through each of the first through fifth flash memory cells M21 through M25. Based on the voltage level of the first node Q21, the voltage levels of the second through fifth nodes Q22 through Q25 are compared by the first through fourth comparators 214 through 217, respectively. Depending on the comparison result of the first through fourth comparators 214 through 217, the low voltage detection signal (LVCC) is outputted or the operations of the first through third charge pump circuits 211 through 213 are controlled. Meanwhile, the outputs of the first through third charge pump circuits 211 through 213 are divided by the first through third voltage dividers 218 through 220. The divided voltages are then applied to the gate terminals of the third through fifth flash memory cells M23 through M25 to control the amount of current of them. Accordingly, the voltage levels of the third through fifth nodes Q23 through Q25 are controlled.

The method of driving the voltage generator for the flash memory device according to the present invention will be described in more detail.

If the power supply voltage (Vcc) is applied and the current paths between the power supply terminal (Vcc) and the ground terminal (Vss) are thus formed, the cell current of the first flash memory cell M21 a gate terminal of which is connected to the ground terminal (Vss) is kept constant. Thus, the first node Q21 keeps a constant voltage level. Meanwhile, the cell current of the second flash memory cell M22 a gate terminal of which is applied with the power supply voltage (Vcc) is changed as the power supply voltage (Vcc) is changed. Accordingly, the voltage level of the second node Q22 is also changed. Variation in the cell current of the second flash memory cell M22 based on the cell current of the first flash memory cell M21, that is, the voltage level of the second node Q22 based on the voltage level of the first node Q21 is compared to the first comparator 214, so that the low voltage detection signal (LVCC) for detecting the low voltage is outputted.

The first charge pump circuit 211 generates the positive high voltage (VPPD) that will be applied to the drain terminal of the main memory cell depending on the output of the second comparator 215. At this time, the positive high voltage (VPPD) generated from the first charge pump circuit 211 is applied to the drain terminal of the main memory cell and is simultaneously divided by the first voltage divider 218. The divided voltage of the first voltage divider 218 is applied to the gate terminal of the third flash memory cell M23 to control the cell current of the third flash memory cell M23. Thereby, the voltage level of the third node Q23 is controlled and the voltage level of the third node Q23 is compared with the voltage level of the first node Q21 by the second comparator 215. The operation of the first charge pump circuit 211 is controlled depending on the comparison result of the second comparator 215.

The second charge pump circuit 212 generates the positive high voltage (VPPI) that will be applied to the gate terminal of the main memory cell, depending on the output of the third comparator 216. The positive high voltage (VPPI) generated from the second charge pump circuit 212 is applied to the gate terminal of the main memory cell and is simultaneously divided by the second voltage divider 219. Also, the divided voltage by the second voltage divider 219 is applied to the gate terminal of the fourth flash memory cell M24 to control the cell current of the fourth flash memory cell M24. Thereby, the voltage level of the fourth node Q24 is controlled and the voltage level of the fourth node Q24 is compared with the voltage level of the first node Q21 by the third comparator 216. The operation of the second charge pump circuit 212 is controlled depending on the comparison result of the third comparator 216.

The third charge pump circuit 213 generates the negative high voltage (VEEI) that will be applied to the source terminal of the main memory cell, depending on the output of the fourth comparator 217. The negative high voltage (VEEI) generated from the third charge pump circuit 213 is applied to the source terminal of the main memory cell and is simultaneously divided by the third voltage divider 220, The divided voltage by the third voltage divider 220 is applied to the gate terminal of the fifth flash memory cell M25 to control the cell current of the fifth flash memory cell M25. Thereby, the voltage level of the fifth node Q25 is controlled. The voltage level of the fifth node Q25 is compared with the voltage level of the first node Q21 by the fourth comparator 217. The operation of the third charge pump circuit 213 is controlled depending on the comparison result of the fourth comparator 217.

Figure 2:
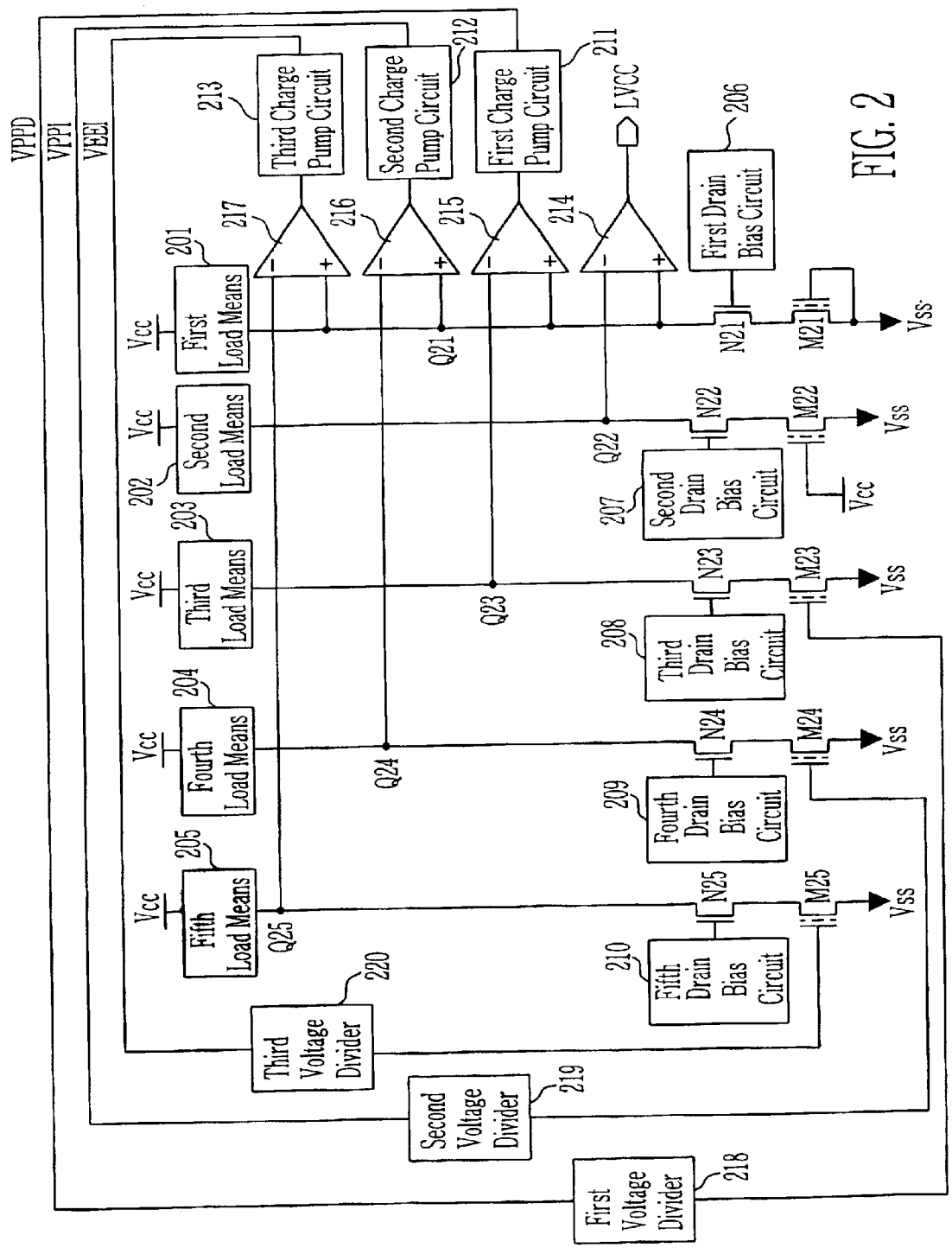
FIG. 2 shows a structure of a voltage generator for a flash memory device having a low-voltage detector, a plurality of comparators and a plurality of charge pump circuits according to the present invention.
Figure 3:
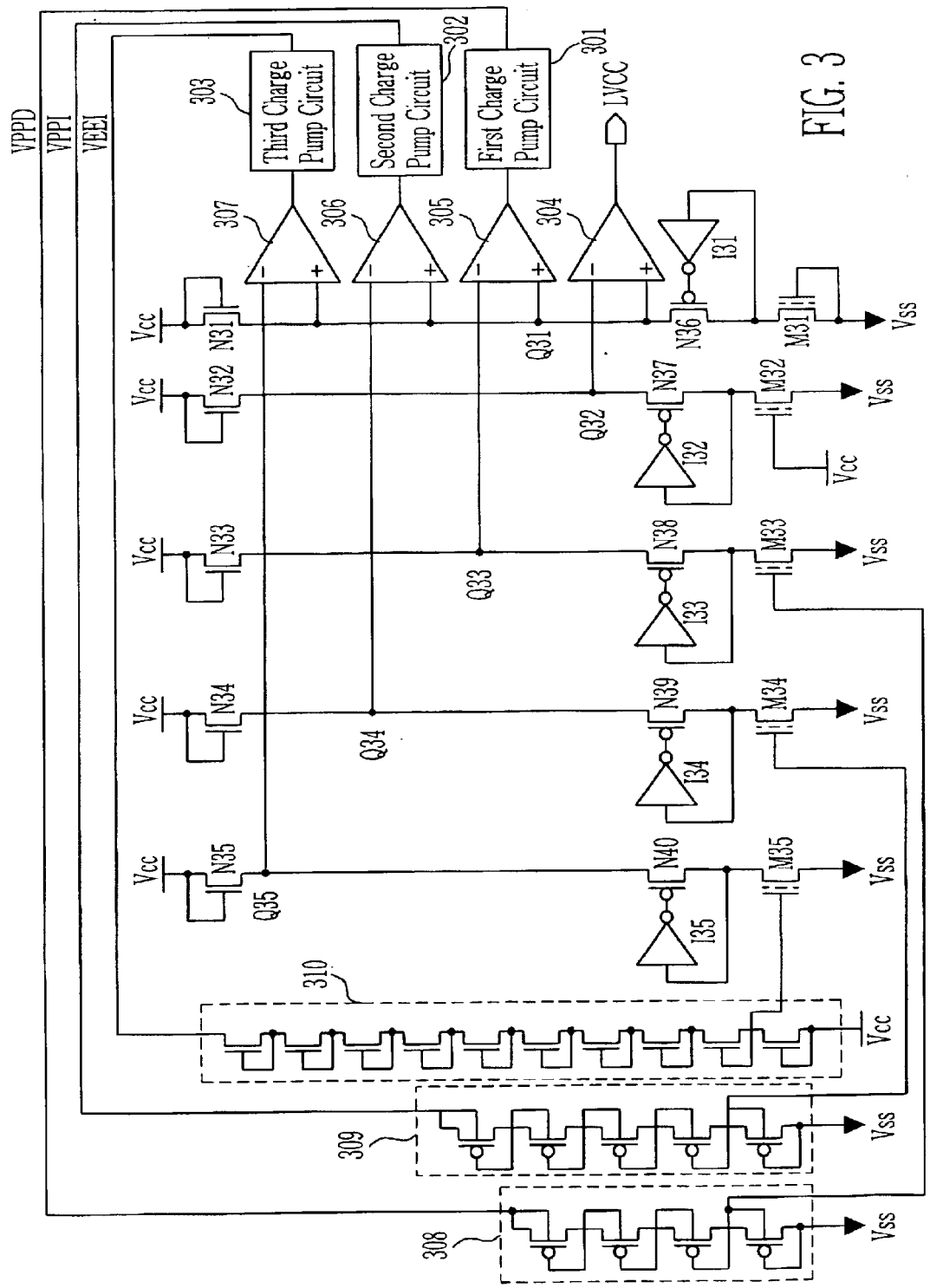
FIG. 3 is a detail circuit of FIG. 2.

FIG. 3 is a detailed circuit of FIG. 2. A load means includes NMOS transistors N31 through N35 to gate terminals of which are connected to the power supply terminal (Vcc). A drain bias circuit includes inverters 131 through 135 for inverting the voltage levels of the drain terminals of the flash memory cells. Also, first and second voltage dividers include a plurality of PMOS transistors that are operated as a diode. A third voltage divider includes a plurality of NMOS transistors that are operated as a diode. At this time, the load means may be variously constructed using the PMOS transistors to the gate terminals of which are connected to the ground terminal (Vss), a diode, a resistor, or the like, as well as the NMOS transistors to the gate terminals of which are connected to the power supply terminal (Vcc).

Figure 4:
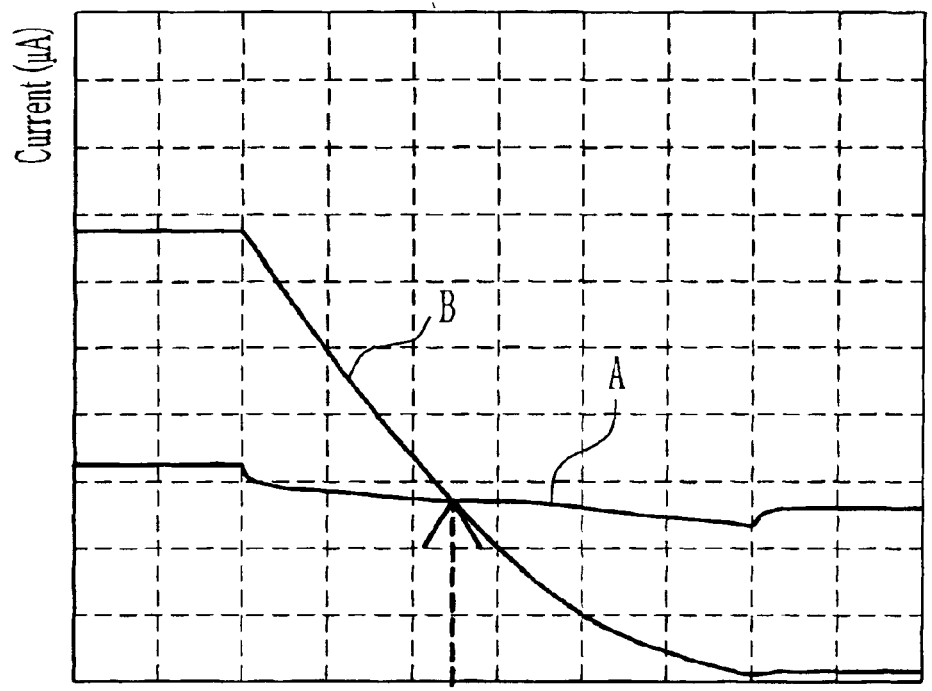
FIG. 4 is a graph showing variation in the current and voltage when a low voltage is detected using the voltage generator according to the present invention.
Figure 4:
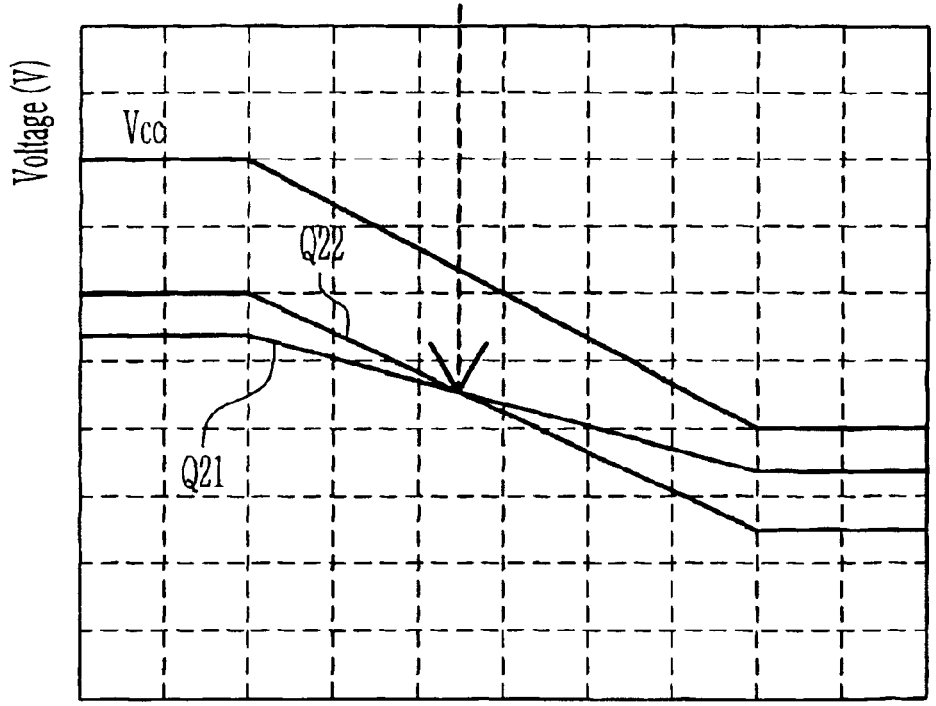

FIG. 4 is a graph showing variation in the current and voltage when the low voltage is detected using the flash memory device according to the present invention.

At a point where a cell current 'A' of the first flash memory cell and a cell current 'B' of the second flash memory cell intersect, the voltage level of the first node Q21 inputted to the first comparator and the voltage level of the second node Q22 intersect. This point becomes the low-voltage detection point. In other words, a point where the cell current 'B' of the second flash memory cell is lower than the cell current 'A' of the first flash memory cell occurs as the power supply voltage (Vcc) is decreased. At this point, the voltage level of the second node Q22 becomes lower than the voltage level of the first node Q21. This point becomes the low-voltage detection point.

Figure 5:
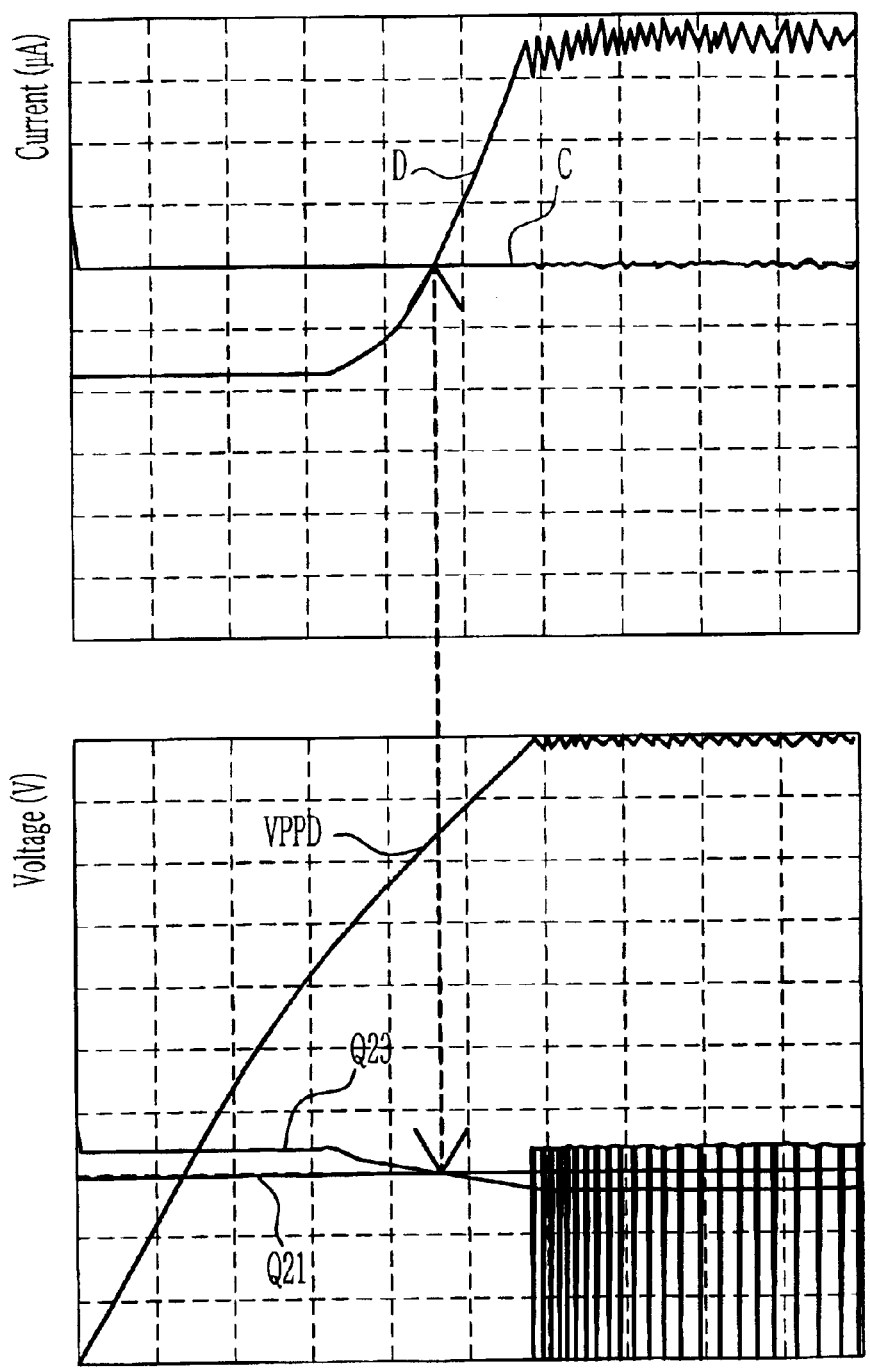
FIG. 5 is a graph showing variation in the current and voltage when they are regulated using the voltage generator according to the present invention.

FIG. 5 is a graph showing variation in the current and voltage when they are regulated using the flash memory device according to the present invention. At a point where the cell current 'C' of the first flash memory cell and the cell current 'D' of the third flash memory cell intersect, the voltage level of the first node Q21 inputted to the second comparator and the voltage level of the third node Q23 intersect. This point becomes the regulation point. In other words, as the pumping voltage (VPPD) of the first charge pump circuit is increased, the divided voltage at the first voltage divider is increased. Accordingly, the voltage applied to the gate of the third flash memory cell is increased. Therefore, the amount of current flowing into the third flash memory cell is increased and the voltage level of the third node is thus lowered. This becomes the regulation point.

As mentioned above, according to the present invention, the cell currents of the over-erased flash memory cells and the cell currents of the weakly-programmed flash memory cells are compared using the plurality of the comparators. The low-voltage detector and the plurality of the charge pump circuits are driven depending on the comparison result. Thus, the reference voltage generator is not required. The present invention has an advantageous effect that it can prevent mal-function of a circuit since the operation of the circuit is not affected by variation in temperature, process and power supply voltage. Also, the present invention has an outstanding effect that it can control the low-voltage detection point or the regulation point by controlling the threshold voltage of the flash memory cell, without modifying the circuit.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A voltage generator for a flash memory device, comprising:
    a low-voltage detector for comparing cell currents of different states of two flash memory cells to detect variation in the power supply voltage; and
    a high voltage generating means for comparing cell currents of different states of at least two or more flash memory cells to generate at least one or more given high voltages,
    wherein the high voltage generating means includes:
    at least one or more charge pump circuits for pumping the power supply voltage to a given high voltage and regulating the power supply voltage to a given level;
    at least one or more voltage dividers for dividing outputs of the charge pump circuits, respectively;
    an over-erased flash memory cell;
    at least one or more programmed flash memory cells; and
    at least one or more comparators for comparing cell currents of the programmed flash memory cells, respectively, based on the cell current of the over-erased flash memory cell and for controlling the charge pump circuits depending on the comparison result.

2. The voltage generator as claimed in claim 1, wherein the low-voltage detector comprises:
    an over-erased flash memory cell;
    programmed flash memory cells; and
    comparators for comparing cell currents of the over-erased flash memory cell and cell currents of the programmed flash memory cells.

3. The voltage generator as claimed in claim 2, wherein the over-erased flash memory cell have a gate terminal connected to the ground terminal.

4. The voltage generator as claimed in claim 2, wherein the programmed flash memory cells have gate terminals to which the power supply voltage is applied.

5. The voltage generator as claimed in claim 1, wherein the over-erased flash memory cell have a gate terminal connected to the ground terminal.

6. The voltage generator as claimed in claim 1, wherein the programmed flash memory cells have gate terminals to which divided voltages by the voltage divider are applied, respectively.

7. A voltage generator for a flash memory device, comprising:
    at least one or more load means for supplying the power supply voltages;
    at least one or more charge pump circuits for pumping the power supply voltages to given high voltages and regulating the power supply voltages to given levels;
    at least one or more voltage dividers for dividing outputs of the charge pump circuits;
    an over-erased flash memory cell;
    at least one or more programmed flash memory cells;
    at least two or more drain bias circuits for adjusting drain voltages of the over-erased flash memory cells and the at least two or more flash memory cells;
    at least two or more switching means driven by the drain bias circuits to establish current paths of the power supply terminals and the flash memory cells; and
    at least two or more comparators for comparing each of cell currents of the programmed flash memory cells based on the cell currents of the over-erased flash memory cell to detect decrease in the power supply voltage or to control the charge pump circuits.

8. The voltage generator as claimed in claim 7, wherein the load means includes one of a PMOS transistor having a gate terminal connected to the ground terminal, a NMOS transistor having a gate terminal connected to the power supply terminal, and a resistor.

9. The voltage generator as claimed in claim 7, wherein the over-erased cell have a gate terminal connected to the ground terminal.

10. The voltage generator as claimed in claim 7, wherein any one of the programmed cells has a gate terminal to which the power supply voltage is applied, and remaining gate terminals to which divided voltages by the voltage dividers are applied respectively.

11. The voltage generator as claimed in claim 7, wherein the drain bias circuit includes an inverting means for inverting the drain voltages of the flash memory cells.

12. The voltage generator as claimed in claim 7, wherein the switching means includes NMOS transistors.

* * * * *